(12) United States Patent
Fletcher et al.

(10) Patent No.: US 11,194,247 B2
(45) Date of Patent: Dec. 7, 2021

(54) EXTRUSION CONTROL BY CAPILLARY FORCE REDUCTION

(71) Applicant: CANON KABUSHIKI KAISHA, Tokyo (JP)

(72) Inventors: Edward Brian Fletcher, Austin, TX (US); Teresa Perez Estrada, Pflugerville, TX (US); Amir Tavakkoli Kermani Ghariehali, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 567 days.

(21) Appl. No.: 15/884,642

(22) Filed: Jan. 31, 2018

(65) Prior Publication Data

US 2019/0235378 A1    Aug. 1, 2019

(51) Int. Cl.
  *G03F 7/00*    (2006.01)
  *B29C 59/02*   (2006.01)

(52) U.S. Cl.
  CPC .......... *G03F 7/0002* (2013.01); *B29C 59/022* (2013.01); *B29C 59/026* (2013.01)

(58) Field of Classification Search
  None
  See application file for complete search history.

(56) References Cited

U.S. PATENT DOCUMENTS

| | | | |
|---|---|---|---|
| 6,936,194 B2 | 8/2005 | Watts | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 8,361,371 B2 | 1/2013 | Khusnatdinov et al. | |
| 8,480,933 B2 | 7/2013 | Truskett et al. | |
| 8,850,980 B2 * | 10/2014 | Sreenivasan | G03F 7/0002 101/483 |
| 9,593,170 B2 | 3/2017 | Ito et al. | |
| 9,610,727 B2 | 4/2017 | Kruijt-Stegeman et al. | |
| 2006/0032437 A1 * | 2/2006 | McMackin | G03F 7/0002 118/100 |

(Continued)

FOREIGN PATENT DOCUMENTS

| | | |
|---|---|---|
| JP | 2011-009641 A | 1/2011 |
| TW | 201036799 A | 10/2010 |

(Continued)

OTHER PUBLICATIONS

Ye et al., Methods for Controlling Spread of Imprint Material, U.S. Appl. No. 15/292,645, filed Oct. 13, 2016.

*Primary Examiner* — Timothy Kennedy
(74) *Attorney, Agent, or Firm* — Daniel Ratoff

(57) ABSTRACT

An imprinting template, an imprinting system, and an imprinting method for imprinting a pattern in a formable material on a substrate. The template includes an edge region that surrounds a pattern region. A full height represents an absolute value of a distance between top surface and bottom surface of the pattern region. The edge region extends to an edge of a mesa of the template. A portion of the edge region may be at least a full height below the top surface of the pattern region. An area of the portion of the edge region may be at least large enough to prevent formable material that is between the template and the substrate from extruding out beyond the edge of the mesa.

13 Claims, 12 Drawing Sheets

(56) References Cited

U.S. PATENT DOCUMENTS

| | | |
|---|---|---|
| 2008/0214010 A1 | 9/2008 | Yoneda et al. |
| 2009/0166317 A1 | 7/2009 | Okushima et al. |
| 2009/0174115 A1 | 7/2009 | Loopstra et al. |
| 2009/0200710 A1 | 8/2009 | Khusnatdinov et al. |
| 2009/0250840 A1 | 10/2009 | Selinidis et al. |
| 2010/0098848 A1 | 4/2010 | Truskett et al. |
| 2011/0018168 A1 | 1/2011 | Wuister et al. |
| 2011/0062623 A1 | 3/2011 | Saito |
| 2011/0318501 A1 | 12/2011 | Saito |
| 2012/0200005 A1 | 8/2012 | Sato |
| 2014/0061969 A1 | 3/2014 | Okamoto et al. |
| 2015/0158240 A1 | 6/2015 | Haase et al. |
| 2015/0217504 A1 | 8/2015 | Nakagawa et al. |
| 2015/0360412 A1 | 12/2015 | Isobayashi |
| 2016/0147143 A1 | 5/2016 | Ito et al. |

FOREIGN PATENT DOCUMENTS

| | | |
|---|---|---|
| WO | 2015/089158 A1 | 6/2015 |
| WO | WO-2015/089158 A1 | 6/2015 |
| WO | 2016/128494 A1 | 6/2016 |

\* cited by examiner

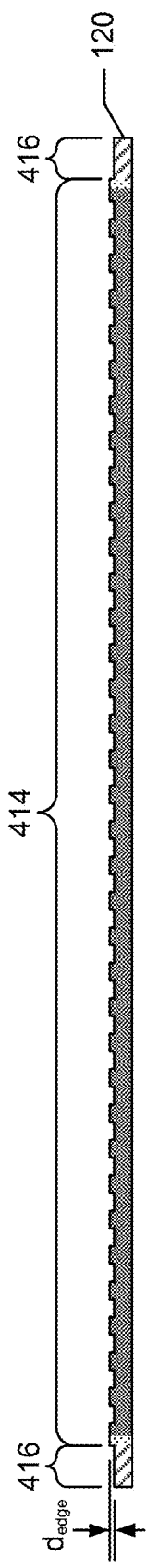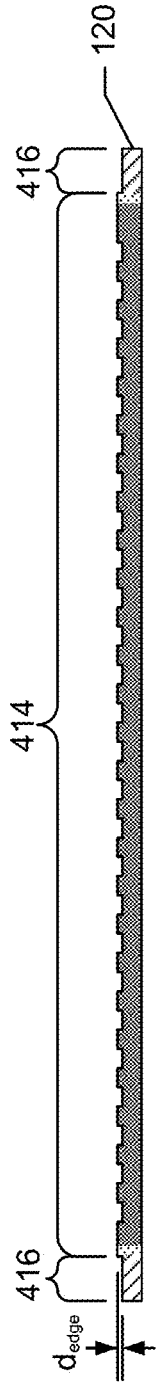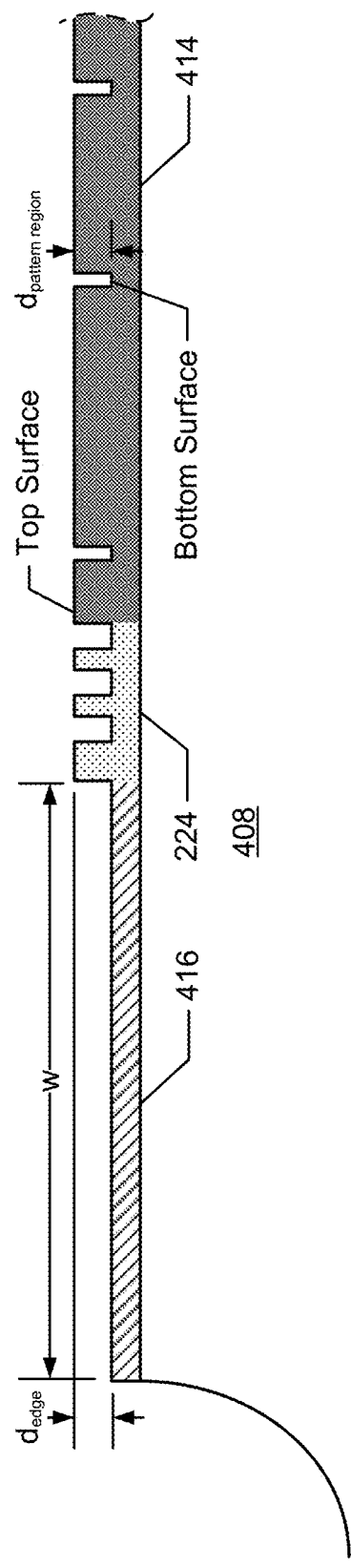

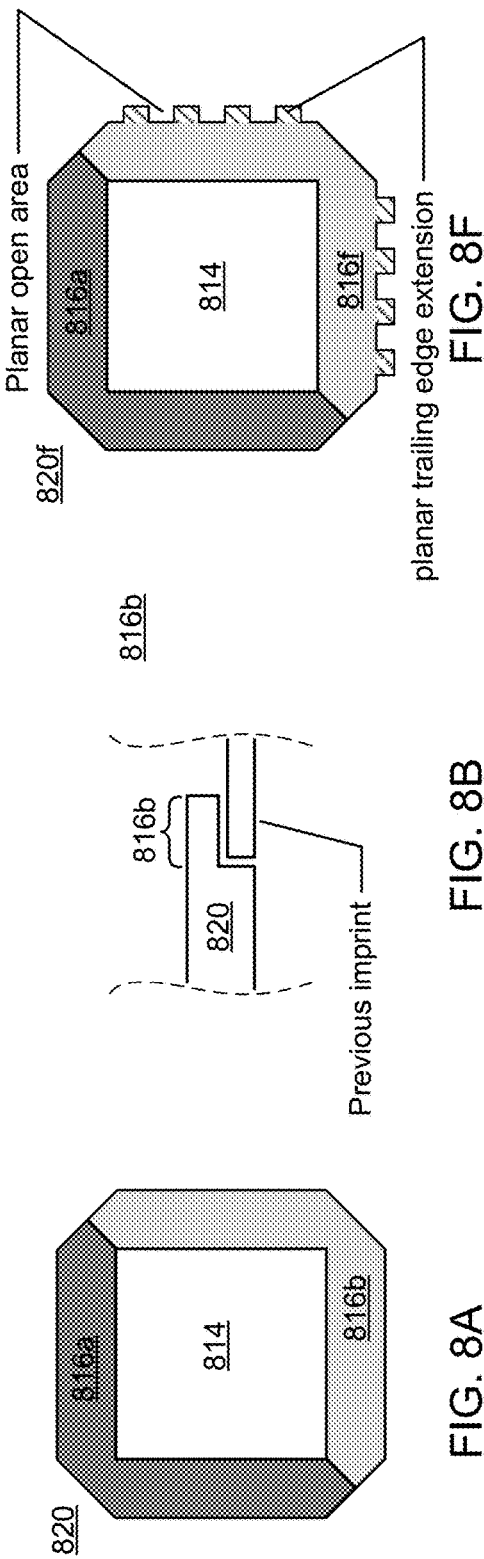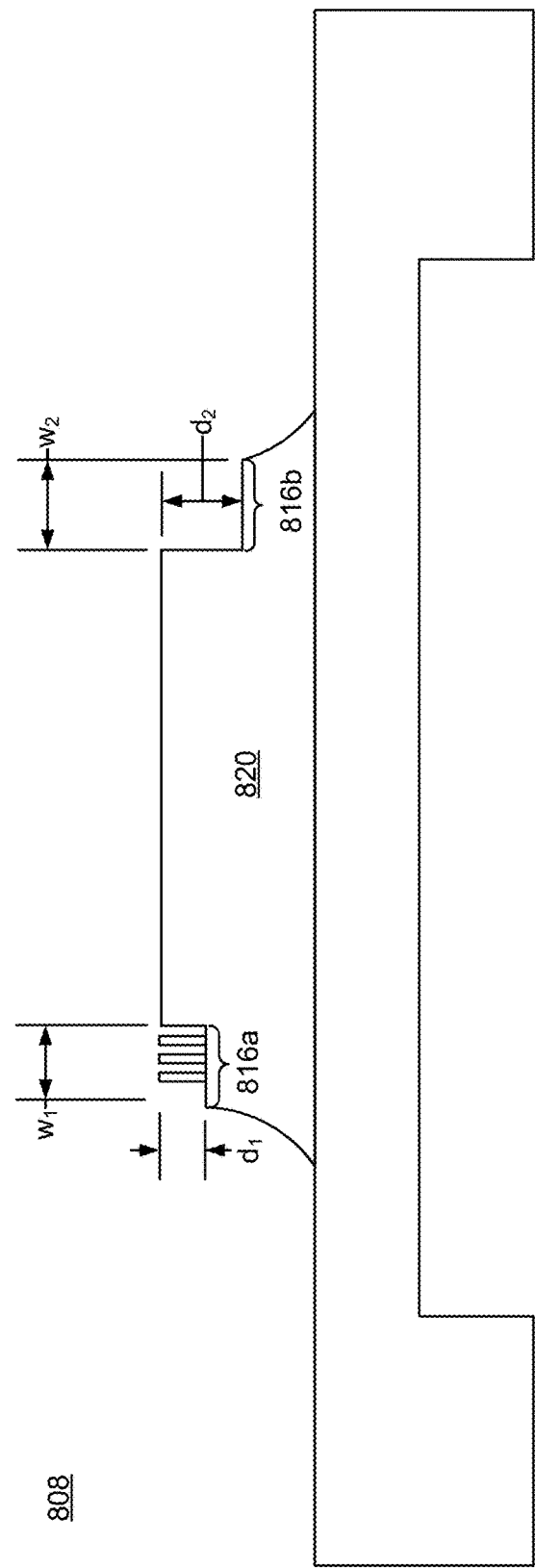
FIG. 8A
FIG. 8B
FIG. 8F
FIG. 8C

EXTRUSION CONTROL BY CAPILLARY FORCE REDUCTION

BACKGROUND

Field of Art

The present disclosure relates to components, systems, and methods for controlling extrusion in a step and repeat imprinting systems, methods, and processes.

Description of the Related Art

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate (i.e. semiconductor wafer). Improvements in nano-fabrication provide greater process control and/or allow continued reduction of the minimum feature dimensions of the structures formed.

An exemplary nano-fabrication technique in use today is nanoimprint lithography. Nanoimprint lithography is useful in a variety of applications including, for example, fabricating layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned U.S. patents includes pressing an imprint template onto a formable material. After the imprint template is pressed into the formable material, the formable material flows into recesses within the imprint template so as to form a pattern. The formable material also flows towards the edges of the template. Any excess formable material may be extruded from the template. Fluid control features on the edges of the imprint template can be used to control where these extrusions form as described in U.S. Pat. No. 8,361,371 which is hereby incorporated by reference.

SUMMARY

At least a first embodiment, may be a template for imprinting a pattern in a formable material on a substrate. The template may include a pattern region that includes a plurality of protrusions and a plurality of recesses. A top surface represents a highest surface among the plurality of protrusions in the pattern region of the template. A bottom surface below the top surface represents a lowest surface among the plurality of recesses in the pattern region of the template. A full height represents an absolute value of a distance between the top surface and the bottom surface. The template may also include an edge region that surrounds the pattern region and extends to an edge of a mesa of the template. At least a first portion of the edge region may be at least a full height below the top surface. An area of the first portion of the edge region may be at least large enough to prevent formable material that is between the template and the substrate from extruding out beyond the edge of the mesa. In an aspect of the first embodiment, the area of the first portion of the edge region is greater than 51% of the edge region.

In an aspect of the first embodiment, the edge region may include a leading region and a trailing region. The leading region may comprise: a leading border area and a top border area. The trailing region may comprise: a trailing border area and a bottom border area. The leading border area and the trailing border area are on opposing sides of the pattern region. The top border area and the bottom border area are on opposing sides of the pattern region. The leading region may be recessed from the top surface at a depth of the full height or less. The trailing region may be recessed from the top surface at a depth greater than the depth of the leading region.

In an aspect of the first embodiment, the leading region may include at least one protrusion that extends upwards from a leading region floor upwards by the full height.

In an aspect of the first embodiment, the trailing region may include at least one protrusion that extends upwards from a trailing region floor upwards to a height that is below the leading region floor.

In an aspect of the first embodiment, a trailing region width may be greater than a leading region width.

In an aspect of the first embodiment, the trailing region may include at least one planar open area. Each open may be surrounded on two sides by planar edge extensions. The planar edge extensions extend outwards away from the pattern region. The leading region may not include any of the planar open areas.

In an aspect of the first embodiment, the trailing region may be recessed from the patterning area at a depth that is 1.1 times or greater than the depth of the leading region.

In an aspect of the first embodiment, a width of the edge region between the pattern region and the edge of the mesa may be greater than 10 times the depth of the edge region.

In an aspect of the first embodiment, the width of the edge region may be greater than 1 µm.

In an aspect of the first embodiment, the area of the first portion of the edge region may be greater than 95% of the edge region.

At least a second embodiment, may be a method of manufacturing an article on a substrate. The method may include contacting a formable material on the substrate with a template in a first imprint field of the substrate. The template may include a pattern region that includes a plurality of protrusions and a plurality of recesses. A top surface represents a highest surface among the plurality of protrusions in the pattern region of the template. A bottom surface below parallel to the top surface represents a lowest surface among the plurality of recesses in the pattern region of the template. A full height represents an absolute value of a distance between the top surface and the bottom surface. An edge region that surrounds the pattern region may extend to an edge of a mesa of the template. At least a first portion of the edge region may be at least a full height below the top surface. An area of the first portion of the edge region may be at least large enough to prevent formable material that is between the template and the substrate from extruding out beyond the edge of the mesa. The method may include curing the formable material in the first imprint field while the template is in contact with the formable material in the first imprint field prior to the formable material extruding from the edge region and after the formable material has entered the edge region.

The second embodiment, may further comprise contacting the formable material with the template in a second imprint field after curing the formable material in the first imprint field. The second imprint field may include an overlap region that overlaps with the first imprint field.

In an aspect of the second embodiment, while contacting the formable material with the template in the second imprint field, a second portion of the edge region may overlap a third portion of the overlap region.

In an aspect of the second embodiment, the first portion of the edge region may overlap a trench formed in a gap between pattern regions on the substrate.

At least a third embodiment, may be an imprinting system for forming a pattern on a substrate. The imprinting system may include a formable material dispenser for dispensing a formable material onto the substrate. The imprinting system may include a template chuck for holding a template. The template may comprise a pattern region that includes a plurality of protrusions and a plurality of recesses. A top surface represents a highest surface among the plurality of protrusions in the pattern region of the template. A bottom surface below the top surface represents a lowest surface among the plurality of recesses in the pattern region of the template. A full height represents an absolute value of a distance between the top surface and the bottom surface. An edge region surrounds the pattern region and may extend to an edge of a mesa of the template. A least a first portion of the edge region may be at least a full height below the top surface away from the substrate. An area of the first portion of the edge region may be at least large enough to prevent formable material that is between the template and the substrate from extruding out beyond the edge of the mesa. The imprinting system may include a positioning system that may be configured to position the template chuck such that the template contacts the formable material on the substrate in a plurality of imprint fields including a first imprint field and a second imprint field. The second imprint field may include an overlap region that overlaps with the first imprint field. Wherein contacting the formable material with the template in the second imprint field, a second portion of the edge region overlaps a third portion of the overlap region.

In an aspect of the third embodiment, the formable material dispenser may dispense droplets of the formable material onto substrate.

In an aspect of the third embodiment, the formable material dispenser may be configured to dispense the formable material onto the second imprint field of the substrate after the positioning system has brought the template into contact with the first imprint field and before the positioning system has brought the template into contact with the second imprint field.

The third embodiment, may further comprise a curing system for solidifying the formable material while the template is in contact with the formable material prior to the formable material extruding from the edge region and after the formable material has entered the edge region.

In an aspect of the third embodiment, the curing system may include a source of actinic radiation that is guided through the template and into the formable material. The formable material may polymerize when exposed to the actinic radiation.

In an aspect of the third embodiment, the edge region may include a leading region and a trailing region. The leading region comprises a leading border area and a top border area. The trailing region comprises a trailing border area and a bottom border area. The leading border area and the trailing border area are on opposing sides of the pattern region. The top border area and the bottom border area are on opposing sides of the pattern region. The leading region may be recessed from the patterning area at a depth of the full height or less. The trailing region may be recessed from the patterning area at a depth greater than the depth of the leading region, wherein the trailing region includes at least one planar open area. Each open may be surrounded on two sides by planar edge extensions. The planar edge extensions extend outwards away from the pattern region. The leading region may not include any of the planar open areas.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

FIGS. 4A-D are illustrations of a mesa of a template as used in an embodiment.

FIGS. 8A-F are illustrations of a template as used in an embodiment.

Figure 1:
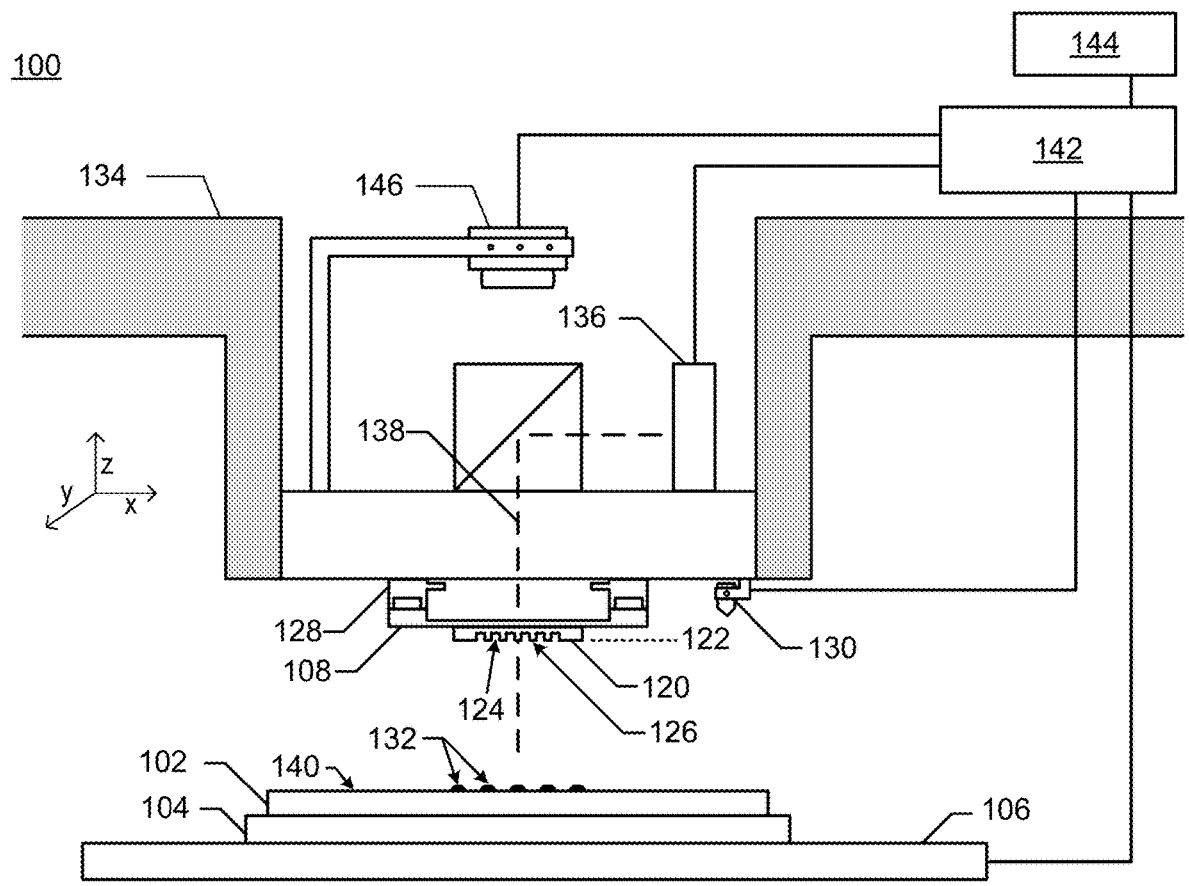
FIG. 1 is an illustration of a nanoimprint lithography system having a template and a mold spaced apart from a substrate.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a way to effectively control extrusions.

First Embodiment

FIG. 1 is an illustration of a nanoimprint lithography system 100 in which an embodiment may be implemented. The nanoimprint lithography system 100 is used to form a relief pattern on a substrate 102. The substrate 102 may be a planar surface such as a semiconductor wafer. Substrate 102 may be coupled to a substrate chuck 104. Substrate chuck 104 may be but is not limited to a vacuum chuck, pin-type, groove-type, electrostatic, electromagnetic, and/or the like.

Substrate 102 and substrate chuck 104 may be further supported by a substrate positioning stage 106. Substrate positioning stage 106 may provide translational and/or rotational motion along one or more of the x, y, z, θ, and φ axes. Substrate positioning stage 106, substrate 102, and substrate chuck 104 may also be positioned on a base (not shown).

Spaced-apart from the substrate 102 is a template 108. Template 108 may include a body having a first side and a second side with one side having a mesa 120 extending towards the substrate 102. Mesa 120 may have a patterning surface 122 (also referred to as an imprinting surface or imprint surface). Mesa 120 may also be referred to as mold 120. The mesa 120 extends towards the substrate 102 and away from the template body. The mesa 120 has a mesa edge that defines the boundaries of an imprint region of the template. The mesa 120 may be a square, rectangle, polygon, or some other symmetric or asymmetric shape.

Template 108 and/or mold 120 may be formed from such materials including, but not limited to: fused-silica, quartz, silicon, organic polymers, siloxane polymers, borosilicate glass, fluorocarbon polymers, metal, hardened sapphire, and/or the like. The patterning surface 122 comprises features defined by a plurality of spaced-apart recesses 124 and/or protrusions 126, though embodiments of the present invention are not limited to such configurations (e.g., planar surface). Patterning surface 122 may define any original pattern that forms the basis of a pattern to be formed on the substrate 102. The spaced-apart recesses 124 and/or protrusions 126 may be spread across the entire patterning surface 122 or just an imprint region of the patterning surface 122. The imprint region may be that region which is intended to be patterned and filled with formable material 132.

Template 108 may be coupled to a template chuck 128. The template chuck 128 may be, but not limited to, vacuum, pin-type, groove-type, electrostatic, electromagnetic, and/or other similar chuck types. Further, template chuck 128 may be coupled to an imprint head which in turn may be moveably coupled to a bridge 134 such that the template chuck 128, the imprint head, and the template 108 are moveable in at least the z-axis direction, and potentially other directions and/or angles. The template chuck 128 may also be coupled to a template positioning stage (not shown) that may provide translational and/or rotational motion along one or more of the x, y, z, θ, and φ axes. The template positioning stage and/or the substrate positioning stage 106 may work together as a positioning system for positioning the template and the substrate relative to each other.

One or more of the bridge, the template chuck 128, processor 142, and the positioning system may be in communication with or included in a positioning system. The positioning system may include motors and/or actuators which are configured to sequentially position the mesa 120 at a plurality of imprint fields on the substrate 102. Each imprint field may be a region of the substrate in which the mesa 120 imposes a pattern onto the substrate 102. Each of the imprint fields among the plurality of imprint fields may overlap one or more adjacent imprint fields.

Nanoimprint lithography system 100 may further comprise a fluid dispensing system 130. Fluid dispensing system 130 may be used to deposit formable material 132 in a non-uniform manner (e.g., polymerizable material) on a substrate 102 as a plurality of droplets of the formable material. Additional formable material 132 may also be deposited upon substrate 102 using techniques, such as, drop dispense, spin-coating, dip coating, chemical vapor deposition (CVD), physical vapor deposition (PVD), thin film deposition, thick film deposition, condensation, and/or the like. Formable material 132 may be disposed upon substrate 102 before and/or after a desired volume is defined between mold 20 and substrate 102 depending on design considerations. For example, formable material 132 may comprise a monomer mixture as described in U.S. Pat. Nos. 7,157,036 and 8,076,386, both of which are herein incorporated by reference.

The nanoimprint lithography system 100 may include an imprint field atmosphere control system such as gas and/or vacuum system that is in communication with a processor 142. The gas and/or vacuum system may include one or more of pumps, valves, solenoids, gas sources, gas tubing, etc. which are configured to cause gas to flow at different times and different regions. The gas and/or vacuum system may be connected to a gas transport system that transports gas to and from the edge of the substrate 102 and controls the imprint field atmosphere by controlling the flow of gas at the edge of the substrate 102. The gas and/or vacuum system may be connected to a gas transport system that transports gas to and from the edge of the template 108 and controls the imprint field atmosphere by controlling the flow of gas at the edge of the template 108. The gas and/or vacuum system may be connected to a gas transport system that transports gas to and from the top of the template 108 and controls the imprint field atmosphere by controlling the flow of gas through the template 108. One, two, or three of the gas transport systems may be used in combination to control the flow of gas in and around the imprint field.

The nanoimprint lithography system 100 may further comprise an energy source 136 that directs energy along path 138. The positioning system may be configured to position template 108 and substrate 102 in superimposition with path 138 and each imprint field on the substrate 102. Camera 146 may likewise be positioned in superimposition with path 138. The nanoimprint lithography system 100 may be regulated by processor 142 in communication with the positioning system, fluid dispensing system 130, source 136, and/or camera 146 and may operate on a computer readable program stored in non-transitory computer readable memory 144.

Either template positioning stage, substrate positioning stage 106, or both vary a distance between mold 120 and substrate 102 to define a desired volume that is filled by the pre-deposited formable material 132 in each imprint field. For example, imprint head may apply a force to template 108 such that mold 120 contacts formable material 132. After the desired volume is filled with formable material 132, source 136 produces energy, (e.g., ultraviolet radiation, actinic radiation), causing formable material 132 to solidify and/or cross-link conforming to a shape of substrate surface 140 and patterning surface 122, defining cured patterned layer on substrate 102. The cured patterned layer may comprise a residual layer (RL) 248 and a plurality of features such as cured protrusions and cured recessions, with cured protrusions having an imprint thickness $t_1$ and RL having a residual layer thickness (RLT) $t_2$. The cured protrusion is formed by recesses 124 and the cured recessions are formed by protrusions 126.

Figure 2A:
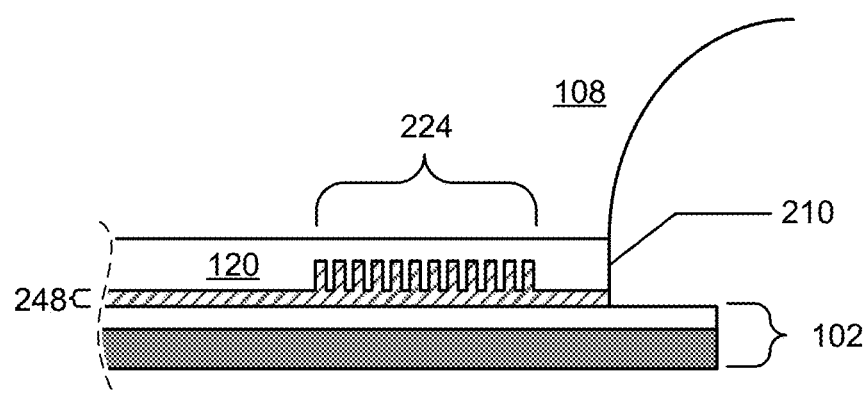
FIGS. 2A-D are illustrations of an extrusion being formed on a substrate.

As illustrated in FIGS. 2A-D if imprinting is not properly performed extrusions 212 can form during the imprinting process. FIG. 2A illustrates a template 108 with a mesa 120. The mesa 120 may include a plurality of fluid control features (FCF) 224 near the mesa sidewall 210. Exemplary patterned FCF are stagger bars, line-space features, pillars, other geometries, and combinations thereof. An exemplary patterned FCF provides less than a 100% fill factor. FCF can be used to reduce local extrusions. The patterned FCF provides a direct path for the fluid to flow that is away from the mesa edge. The patterned FCF may include one or more direction changes in the fluid path which cause the fluid to change direction. Each direction change increases the amount of time it takes the formable material to reach the mesa edge. A local patterned FCF can reduce the time it takes for the formable material fluid front to reach the mesa wall allowing further time for the fluid front to reach other parts of the mesa such as corners.

For example when a droplet of formable material is placed on a substrate close to the edge of the imprint field, then a patterned FCF that is located on the template near where the corresponding droplet will be placed can redirect the local fluid front as it approaches the mesa side wall when the template is brought into contact with the droplet. The patterned FCF can thus control the local fluid front redirecting the movement of the local fluid front away from the mesa edge. The formable material may approach the mesa side wall in an uneven manner due to droplet placement and feature variation on the substrate and template. The patterned FCF can provide local control of the fluid. For example a patterned FCF may include one or more stagger bars each of which has a long arm extending parallel to the mesa sidewall thus changing the direction of the fluid flow away from the mesa sidewall to be parallel to the mesa sidewall. Positioning of the patterned FCF may be done in combination with a droplet dispense pattern.

Figure 2B:
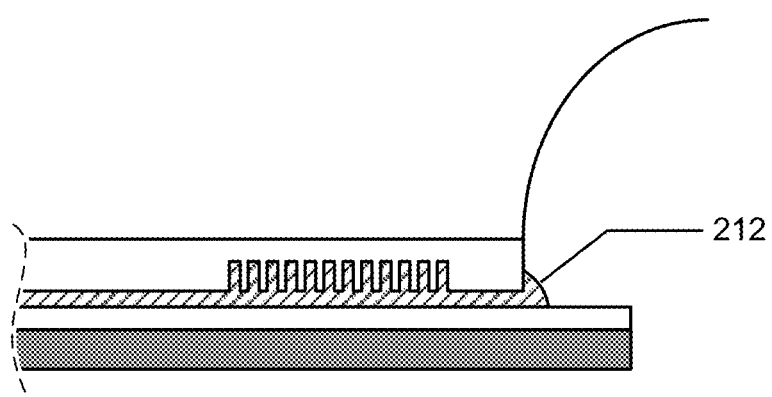
Figure 2C:
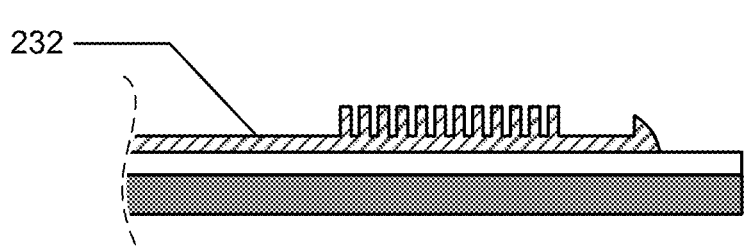
Figure 2D:
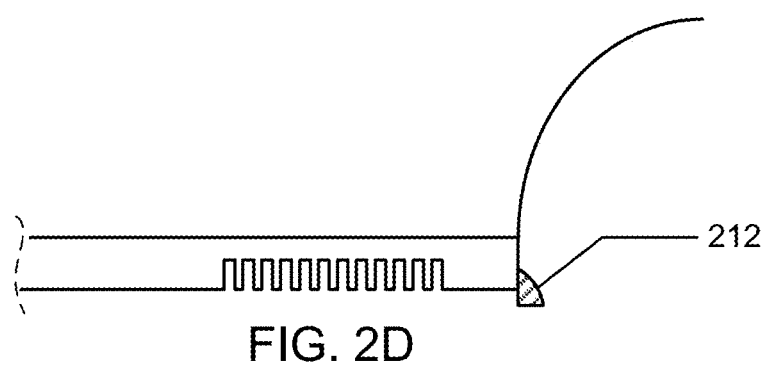

One or more patterned FCF may be placed near the mesa sidewall 210 around a pattern area in a kerf region of the template. A kerf region is a region of the template that produces an imprint on the substrate which after subsequent processing does not produce a device. For example a kerf region may include a region in which dicing occurs. As the mesa 120 contacts the formable material 132 a capillary slit is formed between the mesa 120 and the substrate 102. The residual layer 248 may have a residual layer thickness of around 10-30 nm. Due to the narrowness of the capillary slit, the capillary force remains high all the way to the edge of the mesa which can promote extrusions 212 as illustrated in FIG. 2B. The patterned FCF 224 can reduce the occurrence of extrusions. The applicant has found that patterned FCF 224 is not always sufficient to reduce all extrusions. After separating the template 108 from the substrate 102, the extrusions 212 may remain on the substrate 102 as illustrated in FIG. 2C and/or attach themselves to the mesa side walls 210 as illustrated in FIG. 2D. This extrusion can lead to a variety of imprint and post-imprint defects.

The mesa 120 may include a FCF 224 that improves extrusion performance examples of which are illustrated in US Patent Publication No. 2015/0158240 hereby incorporated by reference. The FCF 224 may be applied to one or both of the mesa 120 and the substrate 102.

Method

Figure 3:
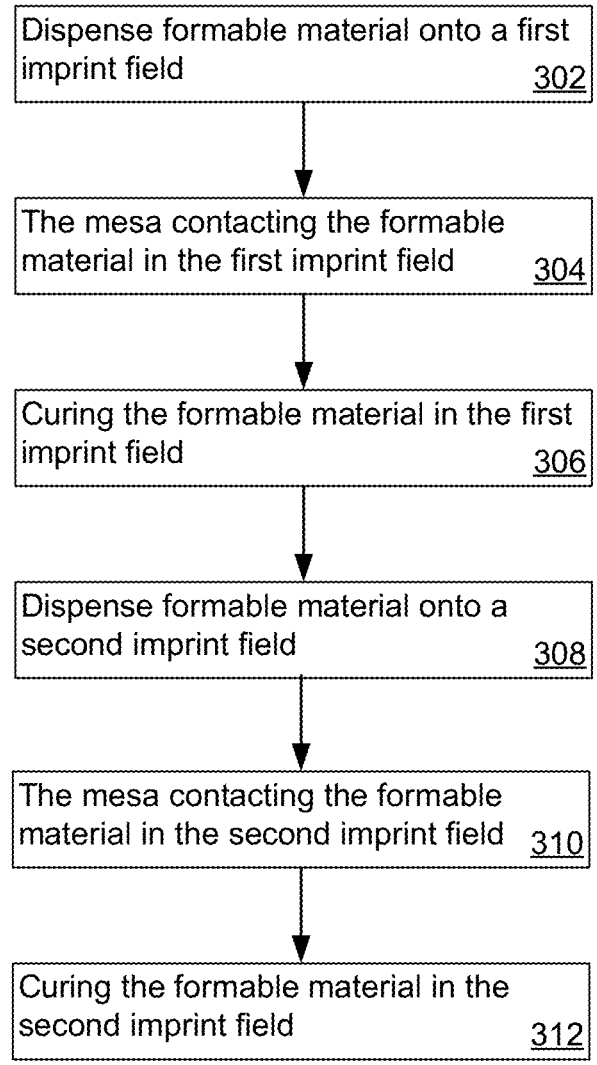
FIG. 3 is an illustration of a method of imprinting as used in an embodiment.

One method of imprinting a substrate is imprinting method 300 as illustrated in FIG. 3. The method 300 may include a first step 302 of dispensing formable material 132 onto a first imprint field of the substrate in a non-uniform manner as a plurality of droplets. A second step 304 may include the mesa 120 contacting the formable material 132 in the first imprint field. The mesa 120 and the substrate 102 may form a capillary slit. The formable material 132 in the capillary slit may spread due to capillary force. As the formable material 132 spreads it fills in recesses and under protrusions of patterns in the mesa 120. A third step 306 may include curing the formable material 132 in the first imprint field while the mesa 120 is in contact with the formable material 132 after the formable material has spread through a pattern region of the mesa 120.

A fourth step 308 may include dispensing formable material 132 onto a second imprint field. The second imprint field may be adjacent to or overlapping the first imprint field. The formable material 132 dispensed onto the second imprint field may overlap the cured formable material in the first imprint field. A fifth step 310 may include the mesa 120 contacting the formable material 132 in the second imprint field. In the second imprint field the mesa 120 and the substrate 102 may form a capillary slit. In the case in which the first imprint field and the second imprint field overlap, the cured formable material in the first imprint field may also form part of the capillary slit in the second imprint field. A sixth step 312 may include curing the formable material 132 in the second imprint field while the mesa 120 is in contact with the formable material 132 after the formable material has spread through a pattern region of the mesa 120.

Template FCF

An embodiment, may include a featureless FCF on a portion or all of the boundary region (edge region) of the mesa 120 and/or the substrate 102. The featureless FCF can be used to reduce the capillary force at the edge of the mesa 120. This featureless FCF may be used separately or in combination with other patterned FCF to reduce extrusions from the mesa 120.

Figure 4A:
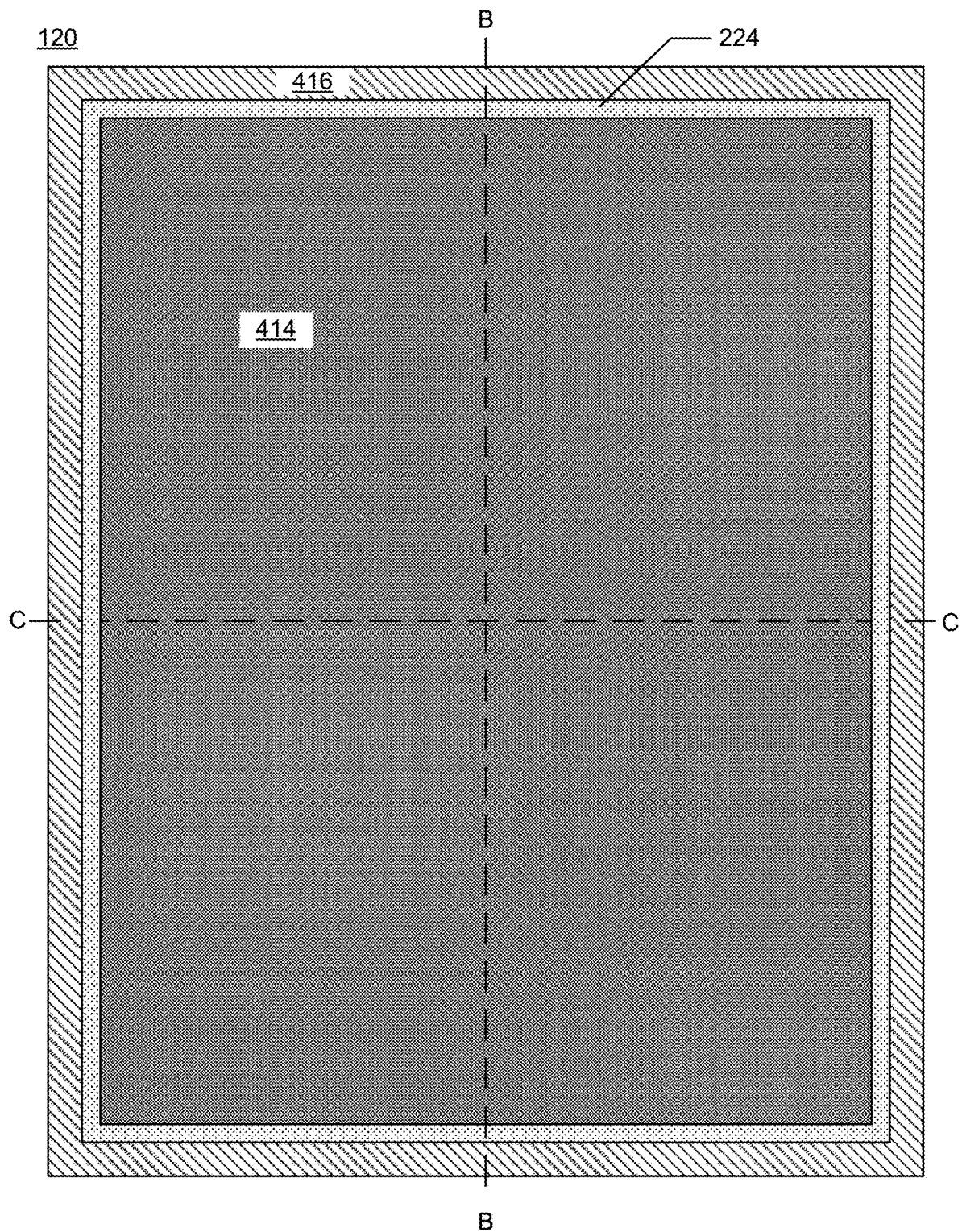

A template may include a mesa 120 as illustrated in FIGS. 4A-D. Mesa 120 may include a pattern region 414 and a border region (edge region) 416. The pattern region is etched to a target etch depth ($d_{pattern\ region}$). The border region has an etch depth of ($d_{edge}$). The template may also include patterned FCF 224 between the border region 416 and the pattern region 414. FIG. 4B is a cross section of mesa 120 along line B-B. FIG. 4C is a cross section of mesa 120 along line C-C. In an embodiment, the border region 416 may have a full height edge (FHE) which acts as the primary featureless FCF surrounding the pattern region 414. In an alternative embodiment, only a portion of the edge region includes a featureless FCF. For example, in one embodiment, at least 51% of the edge region includes a featureless FCF. In another embodiment, 60%, 70%, 80% 90% or 99% of the edge region includes a featureless FCF. The position and percentage of the portion of the featureless FCF that includes the featureless FCF, is governed by the extrusion performance of the mesa without the featureless FCF. Full height (FH) refers to the target etch depth ($d_{pattern\ region}$) for the features in the pattern region 414. FIG. 4D is an illustration of a zoomed in portion of the edge of the mesa which also includes optional patterned FCF 224. The width (w) of the featureless FCF is at least an order of magnitude larger than the depth ($d_{edge}$) of the featureless FCF (w≥10× $d_{edge}$) and is typically much greater than the depth (w>>$d_{edge}$). For example, FH and/or $d_{edge}$ may be on the order of 5 nm to 100 nm, while the width of the featureless FCF (w) may be on the order of 1 μm, 10 μm, 100 μm, or 500 μm. The applicant has found that a large width relative to the narrow depth and the lack of features in the featureless FCF at the edge of the mesa improves the extrusion performance relative to a template without the featureless FCF, while also having little effect on the fabrication process of the template. The area of the border region at the edge should be large enough to prevent the formable material from extruding from the pattern region over the life of the template. The life of the imprint is a number of imprints between the template being cleaned (i.e., 10, 100, 1000, or 10,000 imprints).

The pattern region 414 of the mesa 120 includes a plurality of features made up of both protrusions and recesses. These features are filled up by formable material 132 during the imprinting process. The height of the protrusions may vary or be consistent. The depth of the recesses may vary or be consistent. The top surface is representative of a highest surface among the plurality of protrusions in the pattern region 414 of the mesa 120. The bottom surface is representative of a lowest surface among the plurality of recesses in the pattern region 414 of the mesa 120. As illustrated in FIGS. 4B-D the full height (FH) refers to a distance ($d_{pattern\ region}$) between the top surface and the bottom surface.

Other patterned FCF such as stagger bars, line-space features, pillars, other geometries, and combinations thereof that provide less than the 100% fill factor of the featureless FCF can be combined with the featureless FCF. In an embodiment, the featureless FCF is the outermost FCF structure on the mesa 120. The featureless FCF reduces the capillary force at the edge of the pattern region 414 which reduces the driving force for fluid to extrude. The featureless FCF has a 100% fill factor (no patterned features) in the border region 416.

An alternative embodiment may include the featureless FGF in the border region 416 that has a depth ($d_{edge}$) that is greater than or equal to the full height (FH) ($d_{edge} \geq$FH). The border region 416 may be completely filled or only partially filled when the formable material under the mesa 120 is cured with actinic radiation.

An alternative embodiment may include a shallow featureless FCF in the border region 416 that has a depth ($d_{edge}$) that is less than the full height (FH), but greater than a multiple (B) of the full height, wherein the multiple B is less than 1 and may be 0.1, 0.5, or 0.9 (B×FH<$d_{edge}$<FH). An advantage of the shallow featureless FCF is that it may provide additional benefit for a completely filled border region 416 while still providing capillary force reduction for extrusion control.

Substrate Trench FCF

Figure 5A:
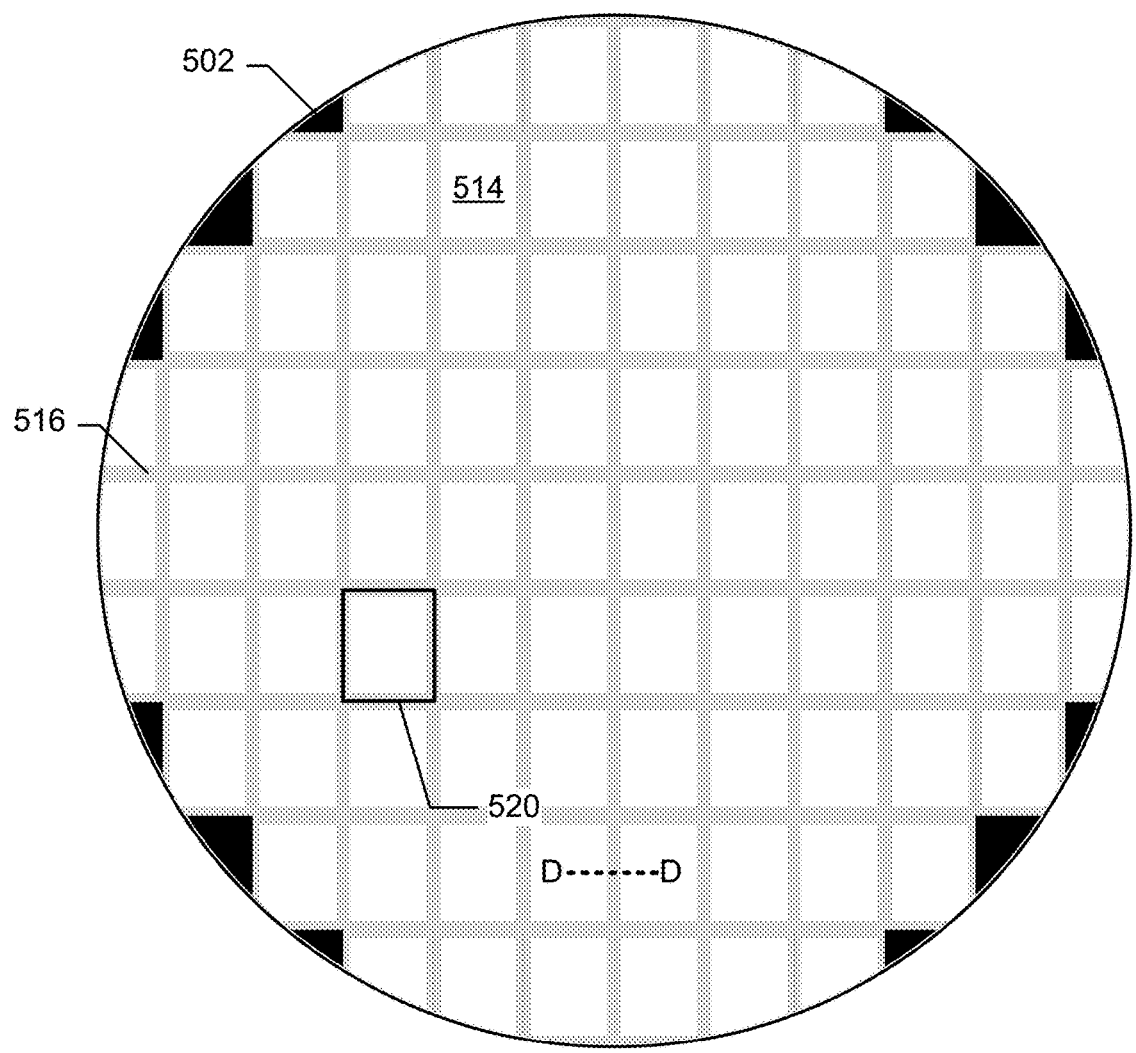
FIGS. 5A-C are illustrations of a substrate as used in an embodiment.
Figure 5B:
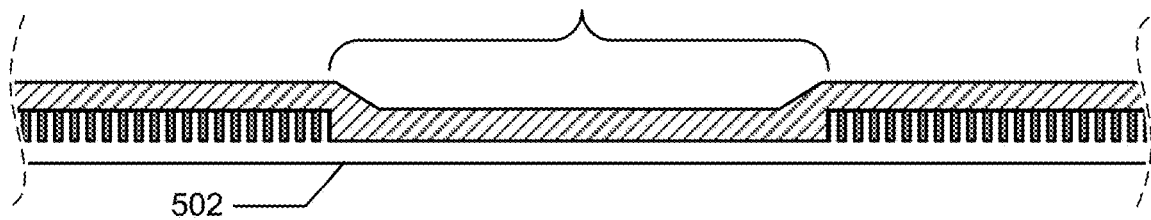
Figure 5C:
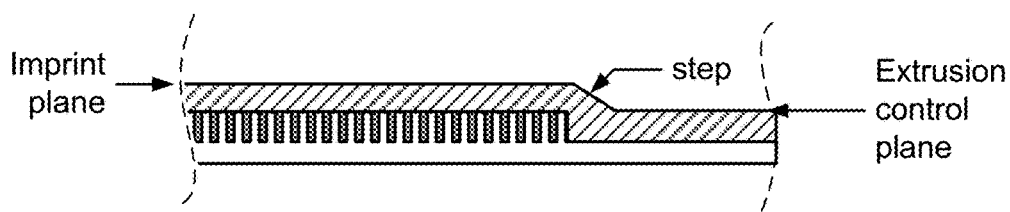

Another embodiment, may be used in combination with a substrate 502 that includes trenches in the gaps between imprints as illustrated in FIGS. 5A-C. Each imprint field may include a plurality of patterning regions 514 which are illustrated in FIG. 5A as white areas. The patterning regions 514 on the substrate include regions that will be patterned with device features which will be eventually incorporated into a device after further fabrication steps. In an alternative embodiment, the patterning region 514 on the substrate may also include features (i.e. patterned FCF or alignment marks) which do not end up in a device after further fabrication steps. Each of the patterning regions 514 are surrounded by trenches 516 which are illustrated in FIG. 5A as gray regions. FIG. 5B is an illustration of a cross section of one of these trenches along line D-D. FIG. 5C is an illustration of a portion of that trench. The substrate 502 may or may not include previously applied patterns as illustrated by the gray patterns in FIGS. 5B-C. The substrate 502 may or may not include an overcoat as illustrated by the slanted line region in FIG. 5B. In an exemplary embodiment, pattern density differences on the substrate created in previous fabrication steps followed by a spin coating process may be used to create the topography for extrusion control. The patterning region 514 may be located on an imprint plane as illustrated in FIG. 5C. The floor of the trench may be located on an extrusion control plane as illustrated in FIG. 5C. There may be a step between the extrusion control plane and imprint plane as illustrated in FIG. 5C.

An embodiment may be configured to operate on a substrate 502 in which topography has been previously applied. The topography is a non-planar surface that provides for increased extrusion control. The non-planarity may be created by typical wafer processing methods such as lithography, etch, imprint, spin coating, etc. The non-planarity may be applied within the boundary of each imprint field, adjacent to each boundary of the imprint field, and/or overlapping the boundary of each imprint field. The non-planarity may extend between gaps between imprint fields. The topography is established by reducing the thickness of the substrate below that of the nominal imprint plane. Essentially a step is formed on the substrate near the edge of each field to be imprinted and defined by the dimensions of the template patterned area.

The step change increases the gap between the mesa 120 and substrate 502 during the imprinting process. As the formable material approaches the edge of the mesa 120, the larger gap decreases the capillary driving force at the edge of the patterning region 514. The trench 516 can provide substantial formable material holding capacity compared to other substrate FCF structures that reduce the fill factor below 100%. Other FCF on the substrate 502 such as stagger bars, line-space features, pillars, other geometries, and combinations thereof that provide comprise less than the 100% fill factor of the trench can be combined with the trench.

In an embodiment, the trench 516 on the substrate is formed so that it is coincides with at least 0.5 μm or 2-30 μm inside the mesa 520, when the pattern region 414 of the mesa is aligned with the patterning region 514 of the substrate as illustrated in FIG. 5A. The trench may have a depth of 5 nm, 10 nm, 30 nm, 60 nm or greater below the nominal imprint plane of the patterning region 514. The volume of the trench should be sufficient to absorb any excess formable fluid. While the depth of trench is sufficient to reduce the capillary force and prevent extrusions. The trench 516 may be formed by walls that are substantially perpendicular to the floor of the trench 516. The trench 516 may be formed by angled walls that connect the floor of the trench 516 with the patterning region 514. The trench 516 may not include a floor but instead include opposing angled walls that connect at a floor line. The trench 516 may be smooth or rough. The trench 516 may include multiple step changes.

The formable material 132 may be dispensed onto the patterning region 514 and away from the trenches 516, such that the formable material 132 does not reach any of the trenches until the mesa 120 comes into contact with the formable material 132.

Figure 6A:
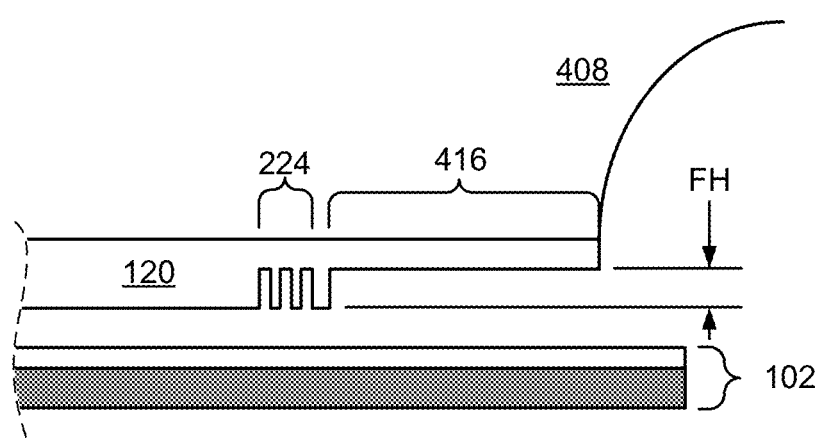
FIGS. 6A-C are illustrations of a substrate and a template as used in an embodiment.

FIG. 6A is an illustration of a template 408 substantially similar to the template illustrated in FIG. 4D suspended over a substrate 102. The template 408 may or may not include a patterned FCF 224 and a border region 416 with a featureless FCF that is full height and has a 100% fill factor. The substrate 102 has previously had formable material 132 dispensed onto the substrate surface 140, after which the mesa 120 contacts the formable material 132, the formable material 132 will start to spread due to the capillary force. The patterned FCF 224 will slow down the flow of the formable material 132 towards the mesa edge, and the full height border region 416 will reduce the capillary force. The applicant has found that use of template 408 reduces the occurrence of extrusion as compared to other templates that do not have a border region 416 with a featureless FCF.

Figure 6B:
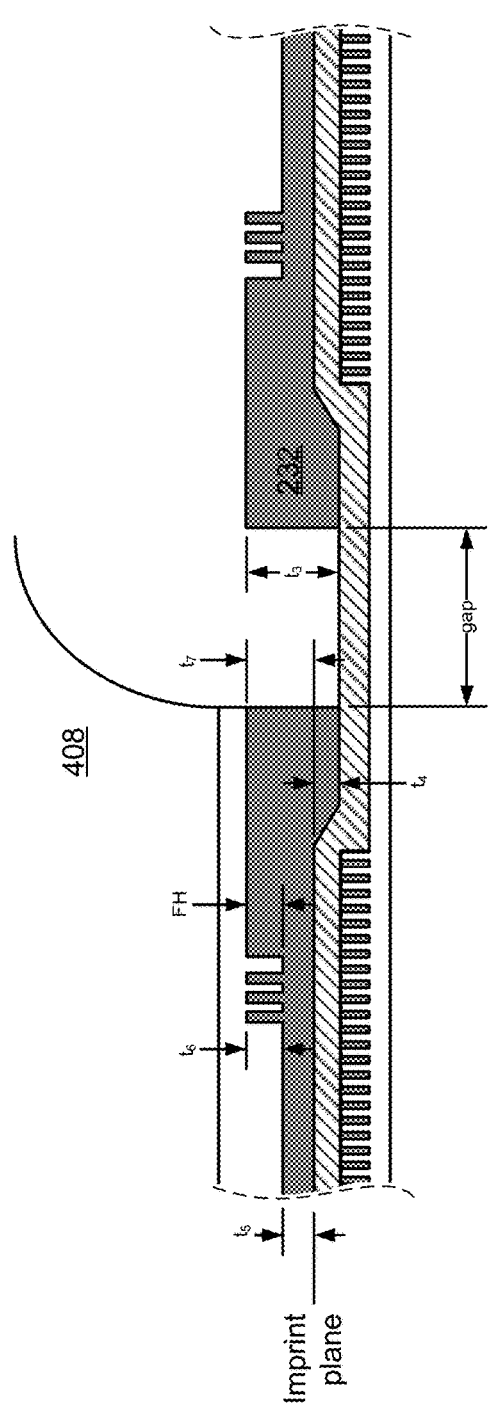
Figure 6C:
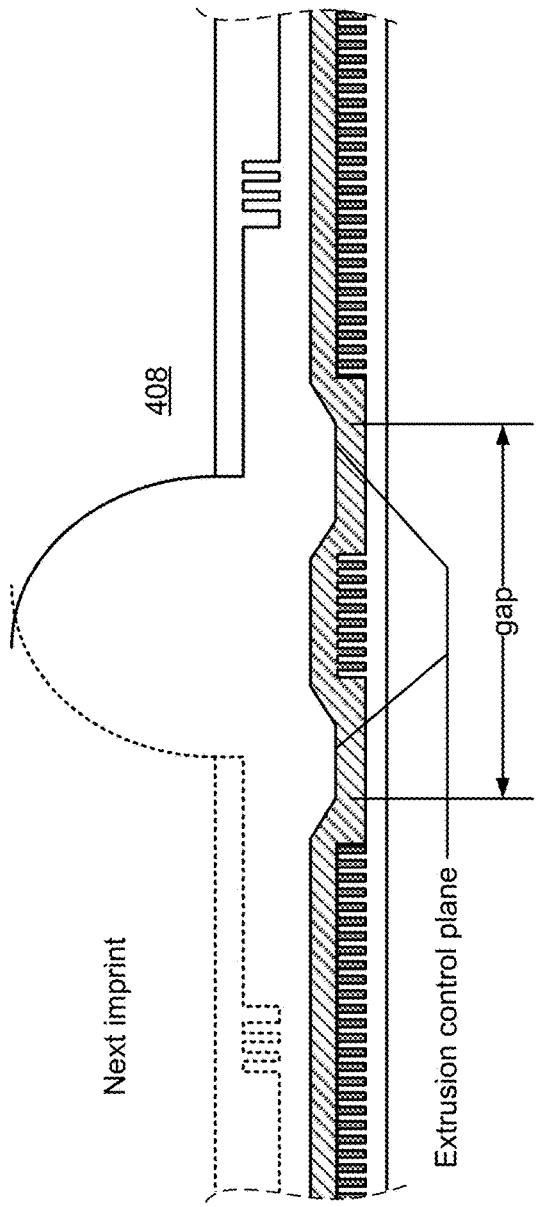

An exemplary embodiment may include a nanoimprint lithography system 100 that is configured to imprint a substrate 502 that was fabricated with a step down with respect to the nominal imprint plane. The substrate 502 includes topography which was created in previous steps which may include optical lithography, imprint, etch, etc. FIGS. 6B-C illustrate an optional overcoat which was applied to the substrate 502 over imprint fields and the gaps between imprint fields. The optional overcoat may include one or more of an adhesion layer, spin on carbon, spin on glass, etc. The nanoimprint lithography system 100 is configured to position the step so that is located within the boundary of the template patterned area. Capillary driving force of the formable material 132 at the edge of the mesa 120 is further reduced even. The imprinting system 100 may position that template 108 such that the mesa edge 610 overlaps the trench 516. The template 108 may or may not include a patterned FCF 224. The substrate 102 has previously had formable material 132 dispensed onto the patterning region 514. After the mesa 120 contacts the formable material 132, the formable material 132 will start to spread due to the capillary force. The FCF 224 will slow down the flow of the formable material 132. Once the formable material 132 reaches an increase in height of the capillary slit will reduce the capillary force.

FIG. 6B is an illustration of a template 408 with a full height border region 416 used to imprint a substrate 502 that includes a trench 516. FIG. 6B illustrates a substrate 502 which has a pattern in a plurality of imprint fields (portions of two imprint fields are illustrated in FIG. 6B). FIG. 6B also illustrates a previous showing a portion of the cured patterned layer 232 formed during a previous imprint shot.

FIG. 6B shows a gap separating the previous imprint shot and an imprint shot in which the formable material 132 which has not yet cured but has spread throughout the capillary slit formed by the mesa and the substrate. The gap between the imprint shots also includes the bottom of the trench 516. In an embodiment, the bottom of the trench 516 may act as an extrusion control plane. From the top of the cured patterned layer 232 to the extrusion control plane may be a thickness $t_3$ (~100 nm). The extrusion control plane may be a distance $t_4$ (~40 nm) below the imprint plane. The top surface of the mesa 120 may be positioned a distance $t_5$ (~20 nm) from the imprint plane. The formable material 132 may form a residual layer (RL) that has a thickness $t_5$ (RLT). The bottom surface of the features in the mesa 120 may be a distance $t_6$ (~40 nm) from a top surface of the mesa 120. These features in the mesa 120 may be formed by etching. The border region 416 may have a depth FH which may be equal the same distance $t_6$. Etching the border region to the same depth as the features can decrease the cost of producing the template 408. The capillary force has an inverse relationship with the thickness of capillary gap. Having a narrow capillary gap $t_5$ in the pattern area of the template speeds the spread of the formable material 132, which has a throughput advantage when the formable material 132 is dispensed as droplets. This is a disadvantage once the formable material reaches the boundary as the capillary force can also push the fluid out of the capillary gap. When a fluid front of the spreading formable fluid reaches the capillary border region the capillary force decreases as the capillary gap increases from $t_5$ to $t_5+FH=t_7$. The capillary force decreases even further as capillary gap increases to $t_4+t_5+FH=t_3$ as the fluid front of the formable material reaches the bottom of the extrusion control plane.

An exemplary embodiment may include a nanoimprint lithography system 100 that is configured to imprint a substrate 502 that was fabricated with gaps that are wide enough to contain two separate and independent extrusion control trenches a step down with respect to the nominal imprint plane as illustrated in FIG. 6C. FIG. 6C illustrates a template brought down close to the substrate but before the formable material has spread throughout the capillary gap. FIG. 6C also illustrates the position of the template when it will perform the next imprint. An advantage of having a barrier between adjacent imprints is that it prevents overflow of the formable material from entering the adjacent imprint field.

Figure 7A:
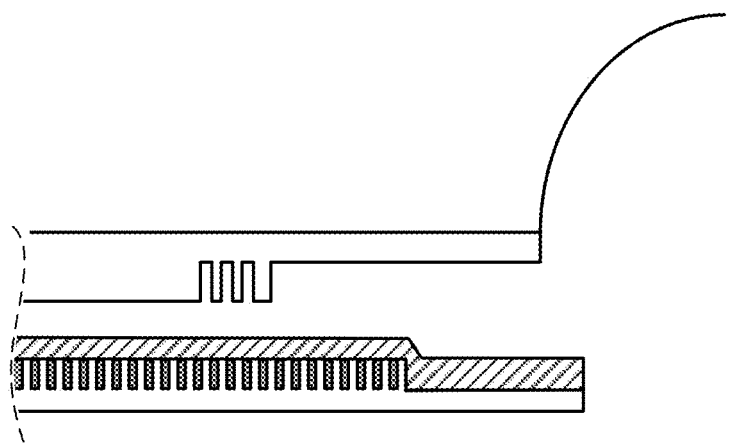
FIGS. 7A-C are illustrations of a substrate and a template as used in an embodiment.
Figure 7B:
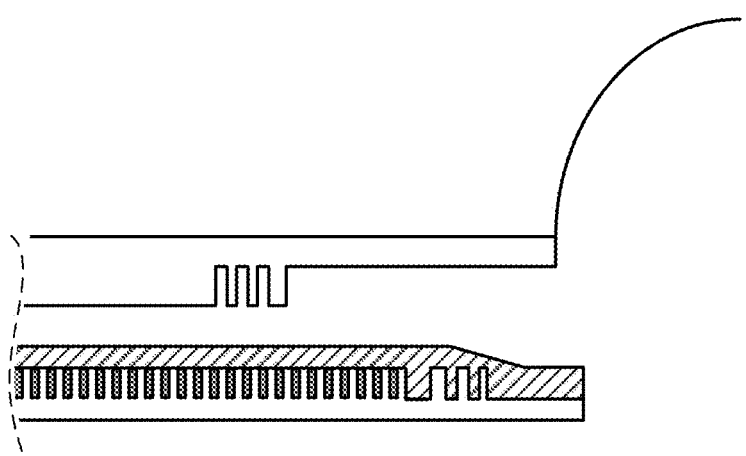
Figure 7C:
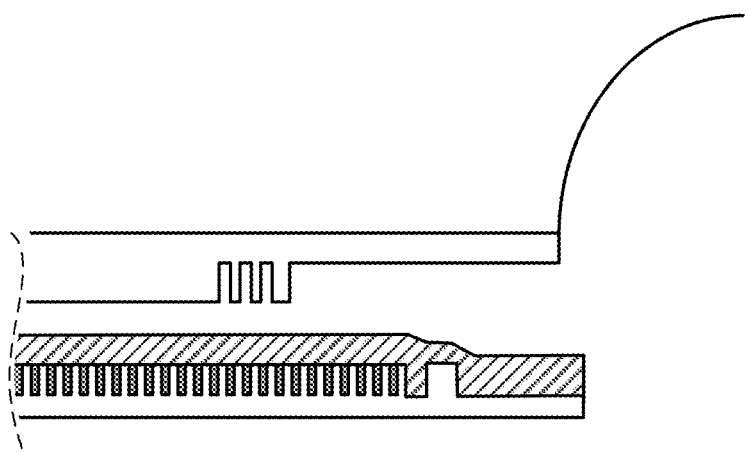

FIGS. 7A-C illustrate substrates with various methods of forming a transition between an imprint plane and an extrusion control plane. FIG. 7A illustrates an embodiment in which the transition between an imprint plane and an extrusion control plane is a steep step change. FIG. 7B illustrates an embodiment in which the transition between an imprint plane and an extrusion control plane is a gradual change. This gradual change may be accomplished by changing the size and/or pitch of the features on the substrate under a conformal layer between the imprinting region and the border region. FIG. 7C illustrates an embodiment that includes a plurality of gradual transitions from an imprint plane to an extrusion control plane. These plurality of gradual transitions may be fabricated by applying an overcoat to a transition region that has one or more features with spacing between the features that creates a plurality of transitions.

Zero Interspace Imprinting

Figure 8D:
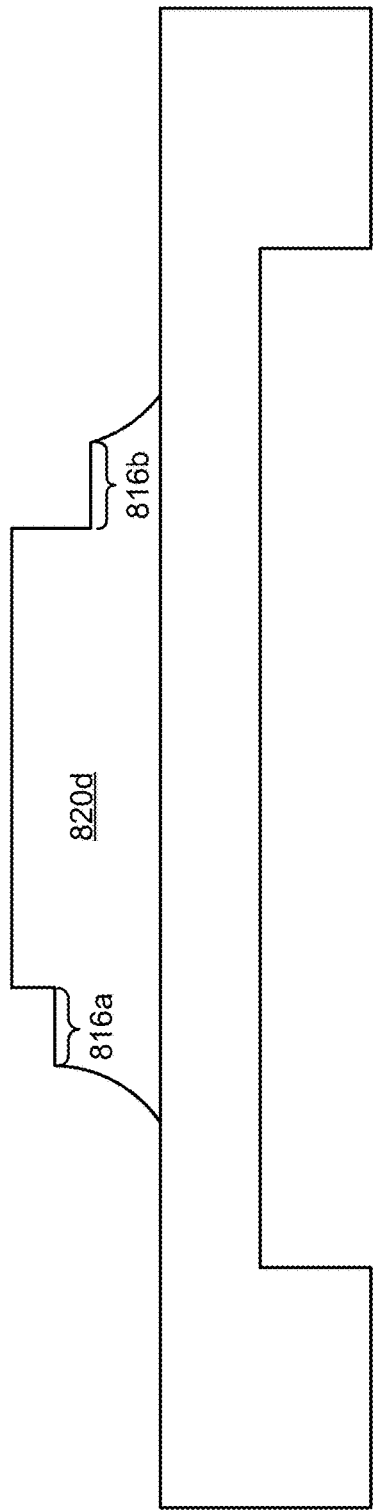

FIGS. 8A-F are illustrations of a template 808 that includes a leading edge 816a with full height edge (FHE) and a trailing edge 816b that has a deeper etch FHE which may be used in a zero interspace imprinting system. A zero interspace imprinting system is a system in which the positioning system positions the template relative to the substrate such that an imprint field abuts and/or overlaps with one or more previous imprint fields as illustrated in FIG. 8B.

A mesa 820 of the template 808 includes the leading edge 816a, a trailing edge 816b, and a pattern area 814. The leading edge 816a may include a template side patterned FCF which may be used to form a substrate side FCF. The leading edge 816a is a portion of the edge region that includes a top border area and leading border area. The trailing edge region is a portion of the edge region that includes the bottom border area and the trailing border area. The leading border area and the trailing border area are on opposing sides of the pattern region. The top border area and the bottom border area are on opposing sides of the pattern region. The leading edge 816a and the trailing edge 816b are in reference to the order in which imprints are made on the substrate. The leading edge 816a may overlap future imprint fields (if they will exist), while the trailing edge does overlap previous imprint fields (if they exist). In an embodiment, the leading edge 816a does not overlap future imprint fields, while the trailing edge does overlap previous imprint fields (if they exist). These substrate side FCF are then covered by the imprint side trailing edge FCF of the next imprint formed by a deeper etch trailing edge FCF as illustrated in FIG. 8C. In an alternative embodiment illustrated in FIG. 8D, a mesa 820d includes a leading edge featureless FCF 816a and a trailing edge deep etch featureless FCF. Likewise the trailing edge 816b includes (patterned or featureless) FCF which are used to cover the leading edge FCF formed in the previous imprint as illustrated in FIG. 8B. The imprinting system may be used to position the leading edge 816a and the trailing edge 816b over the gaps between the imprint fields. In an alternative embodiment, the leading edge 816a is a portion of the edge region that includes one of a top border area or leading border area; the trailing edge is a portion of the edge region that includes one of a bottom border area or a trailing border area; and the leading edge 816a and the trailing edge are on opposing sides of the mesa.

The leading edge FCF is different from the trailing edge FCF. The leading edge FCF 816a has a depth of $d_1$ and the trailing edge FCF 816b has a depth $d_2$ greater than $d_1$ ($d_2 > d_1$). In an embodiment, the leading edge 816a also has a fill factor that is less than 100% includes patterned FCF such as stagger bars, line-space features, pillars, other geometries, and combinations thereof while the trailing edge featureless FCF 816a has 100% fill factor and does not include any patterned FCF. In an embodiment, the leading edge patterned FCF redirects fluid flow away from the mesa edge while trailing edge featureless FCF reduces the capillary force. In an embodiment, the leading edge FCF have the same depth as the pattern features ($d_1$=FH), while the trailing edge FCF have a depth that is greater than the pattern features ($d_2$>FH). The height of fluid control features in the leading edges may be the same or different than the height of the main patterned area (device area), but the trailing edges are etched deeper than the leading edges.

In an alternative embodiment, both the trailing edge 816a and the leading edge 816b have 100% fill factor and do not include patterned FCF and are featureless FCF as illustrated in FIG. 8D.

The applicant has found that having a trailing edge FCF that is different from the leading edge FCF as described above, improves the average convergence rate for aligning the template with the substrate.

The applicant has also found that having trailing edge FCF that is different from the leading edge FCF as described above, reduces extrusion.

In an embodiment, the etch depth of the trailing edges is at least 20 nm deeper than the leading edge FCF ($d_2 \geq d_1 + 20$ nm). In an embodiment, the etch depth of the trailing edges is at least 10%-1000% deeper than the leading edge FCF ($d_2 \geq d_1 \times B$) where B is a multiplication factor between 1.1 and 10, for example B may 1.1, 2, 5, or 10. In an alternative embodiment, the etch depth of the trailing edges is at least 40 nm or 60 nm deeper than the leading edge FCF. The width of the leading edge 816a ($w_1$) is between 1-100 μm. The width of the trailing edge 816b ($w_2$) is between 1-100 μm.

Figure 8E:
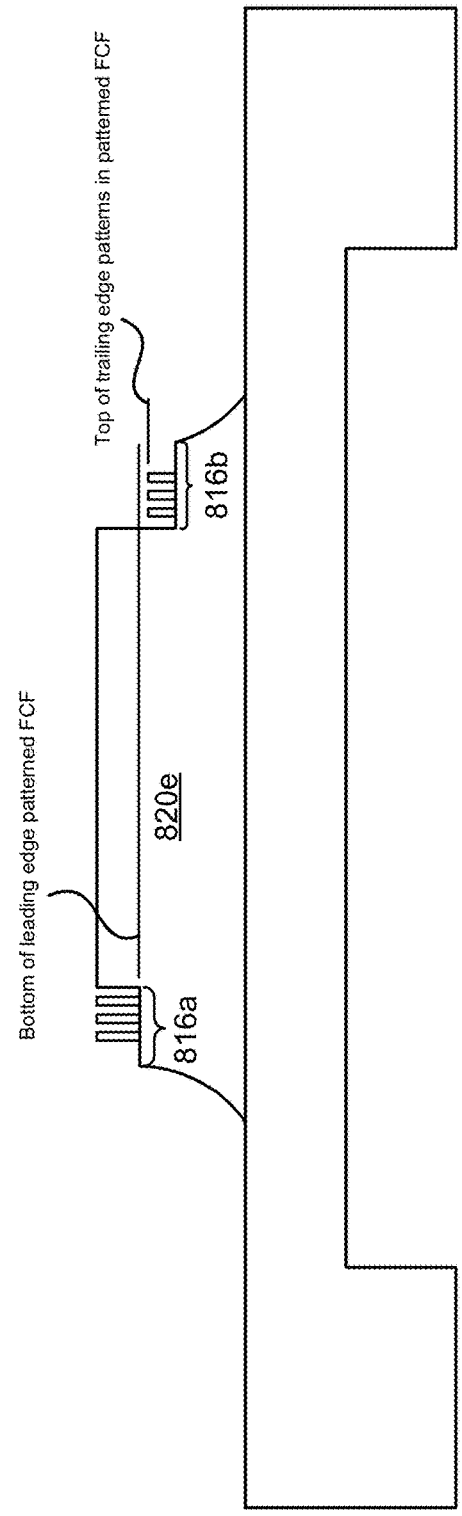
Figure 9A:
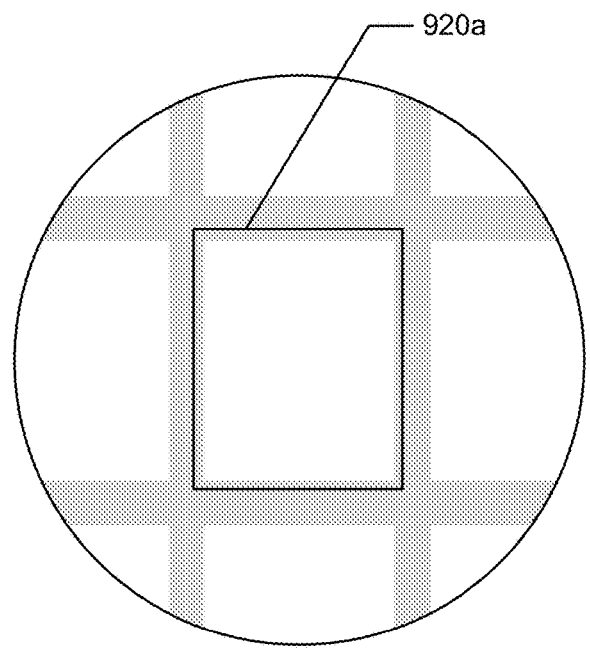
FIGS. 9A-D are illustrations of a substrate as used in an embodiment.
Figure 9B:
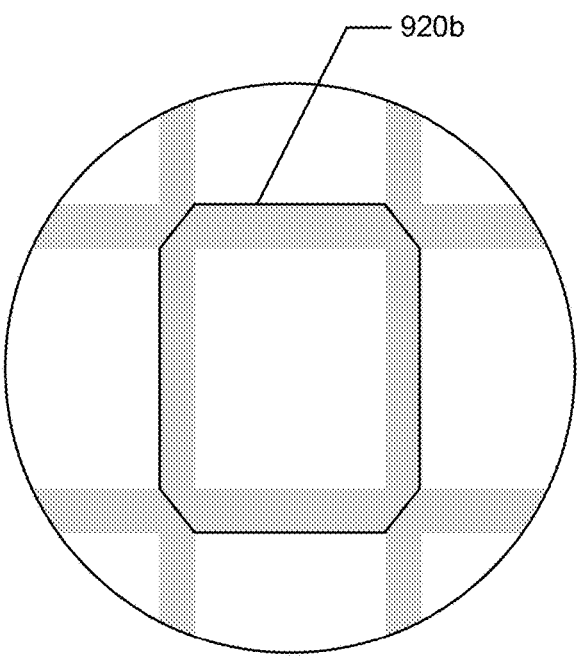
Figure 9C:
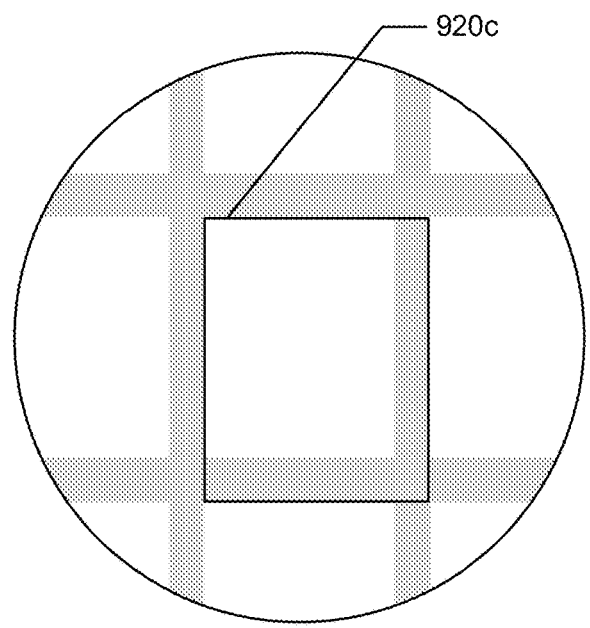
Figure 9D:
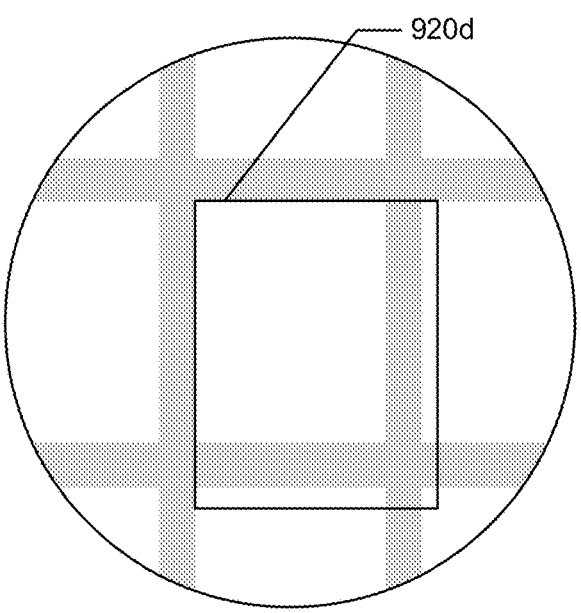

In an alternative embodiment, $w_2$ is greater than $w_1$ such that the trailing edge is extended to cover not only the FCF of the previous imprints, but also some of the features of the previous imprints such as open areas, alignment marks, etc. FIGS. 9A-D illustrate how the mesas 920a-d may overlap with the gaps and previous imprint areas in a zoomed in portion of the substrate illustrated in FIG. 5A. FIG. 9A is an illustration of how a mesa 920a with a uniform featureless FCF may be positioned over a portion of the interspace region which surrounds an imprint field, which may include trenches 516, (interspace regions are illustrated as gray regions in FIGS. 9A-D). FIG. 9B is an illustration of a beveled mesa 920b and how it overlaps a portion of the interspace region. FIG. 9C is an illustration of how a LETE mesa 920c might overlap the interspace region. FIG. 9D is an illustration of how a LETE mesa 920d might overlap the interspace region and previous imprint fields. In an alternative embodiment, the leading edge does overlap a portion or all of the interspace region. An alternative embodiment, may include an LETE mesa with one or beveled or notched corners. An alternative embodiment may, align a mesa with asymmetric portions of the interspace region. FIG. 8E is an illustration of an embodiment, with a mesa 820e in which both the leading edge and the trailing edge include patterned FCF, the top of the trailing edge FCF are below the bottom of the leading edge FCF.

In an alternative embodiment, an asymmetric mesa 820f may include a trailing edge FCF 816f that includes planar open areas as illustrated in FIG. 8F. The one or more planar open areas extend towards the pattern region. The leading edge 816a does not include any planar open areas. In an alternative embodiment, the planar open areas can help prevent marks from being covered with additional formable material while allowing formable material to cover other marks which are then covered by the trailing edge FCF 816f. The planar open areas allow subsequent processing steps (overlay, film thickness, metrology), to take advantage of the unmodified marks (metrology marks or features). Whereas planar trailing edge extensions which surround the planar open areas on two sides increase the process margin for preventing the extrusion of formable material beyond the mesa edge. The planar trailing edge extensions allow formable material to flow over portions of the gap which may include marks which are no longer necessary for subsequent processes. The planar trailing edge extensions are illustrated as slanted line pattered areas in FIG. 8F.

An embodiment may be configured to operate as a zero interspace or substantially a zero interspace process. In a zero interspace process imprint fields are adjacent to each other or overlap each other. The mesa 120 may be configured to have a leading edge and a trailing edge. In an embodiment, the leading edge FCF is different than a trailing edge FCF. In an embodiment, the trailing-edge may be more effective than a leading edge at preventing extrusions when imprinting on a substrates with gaps between imprint fields. In an embodiment with a trailing edge and a leading edge, one of the trailing edge or the leading edge but not both may be bordered by a feature etched to the same depth as the other features on the patterned surface.

The zero interspace imprinting system may make use of a leading edge trailing edge (LETE) template. The applicant has found that the trailing edge 816b may be more effective than the leading edge 816a at preventing extrusions when imprinting substrates that include gaps between the pattern regions 814 of the imprint fields. In an embodiment, the leading edge 816a of mesa 120 may have a FCF region bordered by a residual layer thickness (RLT) region at the mesa edge while the trailing edge of the mesa 120 is bordered by a feature etched to the same depth (or deeper) as the other features on the patterned surface.

The nanoimprint lithography system 100 can be used to fabricate devices on a substrate such as: CMOS logic; microprocessors; NAND Flash memory; NOR Flash memory; DRAM memory; MRAM; 3D cross-point memory; Re-RAM; Fe-RAM; STT-RAM; optoelectronics and other devices in which nanoimprint lithography is used as part of the fabrication process.

Other substrates materials can include but is not limited to: glass; fused silica; GaAs; GaN; InP; Sapphire, AlTiC; and other substrates well known in the art. Devices, fabricated on these substrates include patterned media, field effect transistor devices, heterostructure field effect transistors, light emitting diodes, read/write heads; and the like.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Two or more of the above embodiments, may be combined into a separate embodiment.

What is claimed is:

1. A template for imprinting a pattern in a formable material on a substrate wherein the template includes:
   a pattern region that includes a plurality of protrusions and a plurality of recesses;
      wherein a top surface represents a highest surface among the plurality of protrusions in the pattern region of the template;
      wherein a bottom surface below the top surface represents a lowest surface among the plurality of recesses in the pattern region of the template; and
      wherein a full height represents an absolute value of a distance between the top surface and the bottom surface;
   a featureless edge region that surrounds the pattern region and extends to an edge of a mesa of the template, wherein the featureless edge region is at least a full height below the top surface; and
   wherein a width of the featureless edge region is greater than ten times a depth of the featureless edge region.

2. A template for imprinting a pattern in a formable material on a substrate wherein the template includes:
   a pattern region that includes a plurality of protrusions and a plurality of recesses;
      wherein a top surface represents a highest surface among the plurality of protrusions in the pattern region of the template;
      wherein a bottom surface below the top surface represents a lowest surface among the plurality of recesses in the pattern region of the template; and
      wherein a full height represents an absolute value of a distance between the top surface and the bottom surface;
   an edge region that surrounds the pattern region and extends to an edge of a mesa of the template includes:
      a leading region comprising: a leading border area and a top border area; and
      a featureless trailing region comprising: a trailing border area and a bottom border area;
   wherein the leading border area and the trailing border area are on opposing sides of the pattern region, wherein the top border area and the bottom border area are on opposing sides of the pattern region;
   the leading region is recessed from the top surface at a depth of the full height or less; and
   wherein a width of the featureless trailing region is greater than ten times a depth of the featureless trailing region;
   the featureless trailing region is recessed from the top surface at a depth greater than the depth of the leading region.

3. The template according to claim 2, wherein the leading region is featureless.

4. The template according to claim 2, wherein a trailing region width is greater than a leading region width, wherein the trailing region width is a distance perpendicular to an edge of the trailing border area and the edge of the mesa, wherein the leading region width is a distance perpendicular to an edge of the leading border area and the edge of the mesa.

5. The template according to claim 2, wherein the featureless trailing region includes planar open areas in the trailing border area and different planar open areas in the bottom border area, wherein each planar open area in the trailing border area is surrounded on two sides by two planar edge extensions in the trailing border area, wherein each different planar open area in the bottom border area is surrounded on two sides by two of the planar edge extensions in the bottom border area, wherein the planar edge extensions extend outwards away from the pattern region.

6. The template according to claim 2, wherein the trailing region is recessed from the patterning area at a depth that is 1.1 times or greater than the depth of the leading region.

7. The template according to claim 1, wherein the width of the featureless edge region is greater than 1 µm.

8. An imprinting system for forming a pattern on a substrate comprising:
   a formable material dispenser for dispensing a formable material onto the substrate;
   a template chuck for holding a template, the template comprising:
      a pattern region that includes a plurality of protrusions and a plurality of recesses;
         wherein a top surface represents a highest surface among the plurality of protrusions in the pattern region of the template;
         wherein a bottom surface below the top surface represents a lowest surface among the plurality of recesses in the pattern region of the template; and
         wherein a full height represents an absolute value of a distance between the top surface and the bottom surface;
      a featureless edge region that surrounds the pattern region and extends to an edge of a mesa of the template, wherein the featureless edge region is at least a full height below the top surface away from the substrate; and
      wherein a width of the featureless edge region is greater than ten times a depth of the featureless edge region;
   a positioning system configured to position the template chuck such that the template contacts the formable material on the substrate in a plurality of imprint fields including a first imprint field and a second imprint field;
   wherein the second imprint field includes an overlap region that overlaps with the first imprint field;
   while contacting the formable material with the template in the second imprint field, a second portion of the edge region overlaps a third portion of the overlap region.

9. The imprinting system according to claim 8 wherein the formable material dispenser dispenses droplets of the formable material onto the substrate.

10. The imprinting system according to claim 8 wherein the formable material dispenser is configured to dispense the formable material onto the second imprint field of the substrate after the positioning system has brought the template into contact with the first imprint field and before the positioning system has brought the template into contact with the second imprint field.

11. The imprinting system according to claim 8 further comprising:
   a curing system for solidifying the formable material while the template is in contact with the template prior to the formable material extruding from the edge region and after the formable material has entered the edge region.

12. The imprinting system according to claim 11 wherein the curing system includes a source of actinic radiation that is guided through the template and into the formable material, and the formable material polymerizes when exposed to actinic radiation.

13. The imprinting system according to claim 8,
the featureless edge region includes:
    a leading region comprising: a leading border area and a top border area; and
    a featureless trailing region comprising: a trailing border area and a bottom border area;
wherein the leading border area and the trailing border area are on opposing sides of the pattern region, wherein the top border area and the bottom border area are on opposing sides of the pattern region;
the leading region is recessed from the patterning area at a depth of the full height or less; and
the featureless trailing region is recessed from the patterning area at a depth greater than the depth of the leading region, wherein the trailing region includes planar open areas in the trailing border area and different planar open areas in the bottom border area, wherein each planar open area in the trailing border area is surrounded on two sides by planar edge extensions in the trailing border area, wherein each different planar open area in the bottom border area is surrounded on two sides by two of the planar edge extensions in the bottom border area, wherein the planar edge extensions extend outwards away from the pattern region.

* * * * *